US011069509B1

(12) United States Patent
Clarke et al.

(10) Patent No.: US 11,069,509 B1
(45) Date of Patent: Jul. 20, 2021

(54) METHOD AND SYSTEM FOR BACKSIDE PLANAR VIEW LAMELLA PREPARATION

(71) Applicant: FEI Company, Hillsboro, OR (US)

(72) Inventors: James Clarke, Hillsboro, OR (US); Brian Routh, Jr., Hillsboro, OR (US); Micah LeDoux, Hillsboro, OR (US); Cliff Bugge, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 4 days.

(21) Appl. No.: 16/819,945

(22) Filed: Mar. 16, 2020

(51) Int. Cl.
*H01J 37/304* (2006.01)
*H01J 37/305* (2006.01)
*G01N 1/32* (2006.01)
*G01N 23/2202* (2018.01)
*H01J 37/22* (2006.01)
*H01J 37/28* (2006.01)
*G01N 23/2251* (2018.01)

(52) U.S. Cl.
CPC ............ *H01J 37/3056* (2013.01); *G01N 1/32* (2013.01); *G01N 23/2202* (2013.01); *G01N 23/2251* (2013.01); *H01J 37/222* (2013.01); *H01J 37/28* (2013.01); *H01J 2237/006* (2013.01); *H01J 2237/2802* (2013.01); *H01J 2237/2814* (2013.01)

(58) Field of Classification Search
CPC ......... H01J 37/304; H01J 37/305–3056; H01J 37/28; G01N 1/32; G01N 23/2202; G01N 23/2251
See application file for complete search history.

(56) References Cited

U.S. PATENT DOCUMENTS

| 5,501,893 | A | 3/1996 | Laermer et al. |
| 8,778,804 | B2 | 7/2014 | Randolph et al. |
| 8,859,963 | B2 * | 10/2014 | Moriarty .................. G01N 1/32 |
| | | | 250/307 |
| 10,546,719 | B2 | 1/2020 | Franco et al. |
| 2003/0047691 | A1 | 3/2003 | Musil et al. |
| 2007/0010097 | A1 * | 1/2007 | Deering .............. H01J 37/3056 |
| | | | 438/690 |

\* cited by examiner

*Primary Examiner* — Eliza W Osenbaugh-Stewart

(57) ABSTRACT

The backside of a planar view lamella is prepared from a sample extracted from a workpiece. The sample includes multiple device layers and a substrate layer. After removing at least a part of the substrate layer covering a final device layer to obtain a sample surface, a region of interest (ROI) relative to the sample surface is alternately scanned with an electron beam and spontaneously etched until the final device layer within the ROI is exposed. One or more device layers may be removed from the sample backside after the final device layer is exposed to obtain the backside of the planar view lamella.

20 Claims, 7 Drawing Sheets

METHOD AND SYSTEM FOR BACKSIDE PLANAR VIEW LAMELLA PREPARATION

FIELD OF THE INVENTION

The present description relates generally to methods and systems for preparing a lamella, more particularly, to processing the backside of a planar view lamella.

BACKGROUND OF THE INVENTION

Transmission electron microscope (TEM) requires a specimen to be sufficiently thin so that electrons transmitted through the specimen may be used to form an image. One way to prepare the TEM sample is to extract a sample by milling a workpiece using a focused ion beam (FIB). The extracted sample is then thinned from a frontside and a backside to form the thin TEM sample, i.e., a lamella. A planar view lamella may be prepared in order to perform failure analysis on microelectronic devices, such as microelectronic devices with 3D-NAND structure. The planar view lamella has frontside and backside surfaces extending parallel to the device layer and can be used to observe a specific layer of the 3D-NAND structure.

One method to prepare the planar view lamella is disclosed by Franco, et al., in US 2018/0350558A1. Therein, the backside of the lift-out sample is thinned using FIB with or without the presence of an etch-assisting gas. However, applicant recognizes that in order to ensure that the lamella backside is parallel to the device layer, the sample backside surface formed before being thinned with the FIB has to be parallel to the device layer. One method to ensure the sample backside surface is parallel to the device layer is to spontaneously etch the sample backside with an etching gas, such as $XeF_2$. The $XeF_2$ may selectively etch the silicon substrate while preserving the device layer. However, applicant recognizes that when preparing sample with 3D-NAND structure, $XeF_2$ may over-etch polycrystalline silicon in the device layers. As a result, the etched surface may be uneven. Further, device layers adjacent to the substrate layer may be damaged during the etching process.

SUMMARY

In one embodiment, a method for processing a sample including at least a substrate layer and a device layer using charged particle beams comprises: removing at least a part of the substrate layer to obtain a sample surface; scanning a region of interest (ROI) relative to the sample surface with an electron beam; flowing a first gas towards the ROI to spontaneously etch the scanned ROI; and scanning the etched ROI with the electron beam responsive to the device layer not being exposed in the ROI. In this way, a planar view lamella with a flat backside surface may be formed from the processed sample.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

Like reference numerals refer to corresponding parts throughout the several views of the drawings.

DETAILED DESCRIPTION OF EMBODIMENTS

The following description relates to systems and methods for preparing the backside of a planar view lamella for imaging in a transmission electron microscope (TEM). The preparation can be performed in a dual beam system shown in FIG. 1. The dual beam system has a first column for forming an ion beam and a second column for forming an electron beam.

Figure 4:
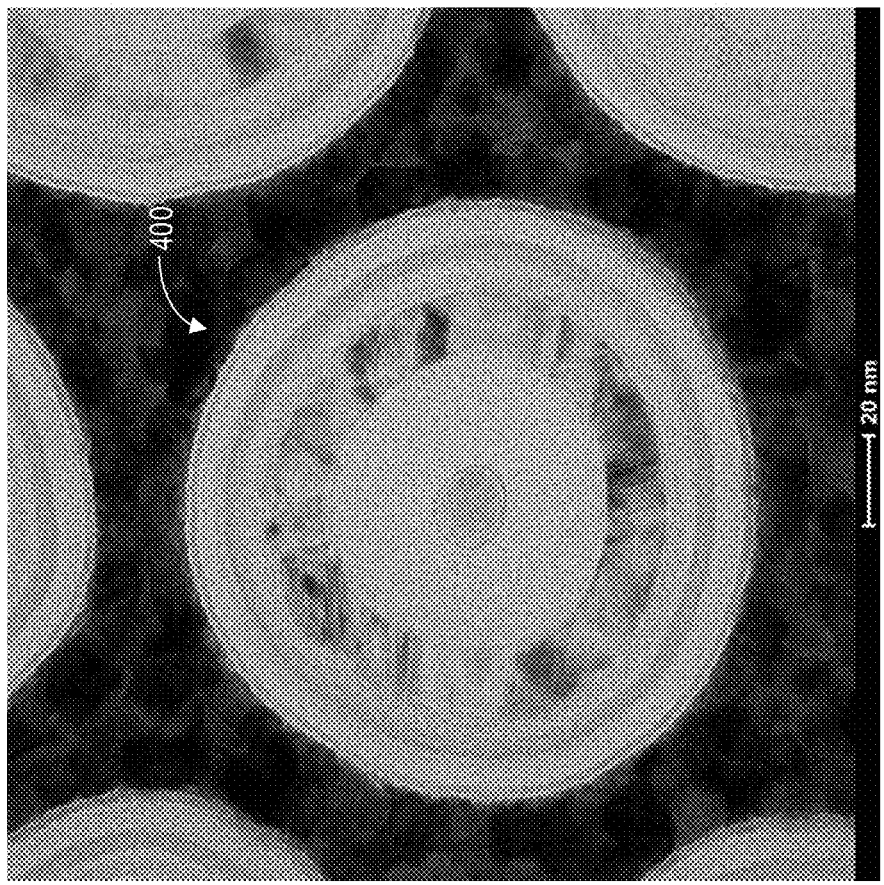
FIG. 4 shows a part of a device layer of a 3D-NAND structure.
Figure 4:
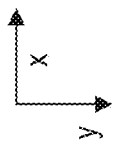

Specific device layer of a workpiece may be inspected based on high resolution TEM image of a planar view lamella prepared from the workpiece. In one example, the workpiece with a 3D-NAND structure may include tens layers of integrated circuit (IC) chips manufactured on a silicon substrate. FIG. 4 is a TEM image showing a part of a device layer of the 3D-NAND structure. The x-y cross-sections of multiple vertical structures can be observed in the TEM image. Each memory cell 400 includes concentric layers of materials including silicon dioxide, polysilicon, and silicon nitride. The vertical structures extend in the z-direction. The device layers in the 3D-NAND structure may be separated from each other by a spacing material, such as silicon dioxide. Metrologies of the device structures (such as the memory cells) in a specific device layer may be determined from the TEM images.

Figure 2:
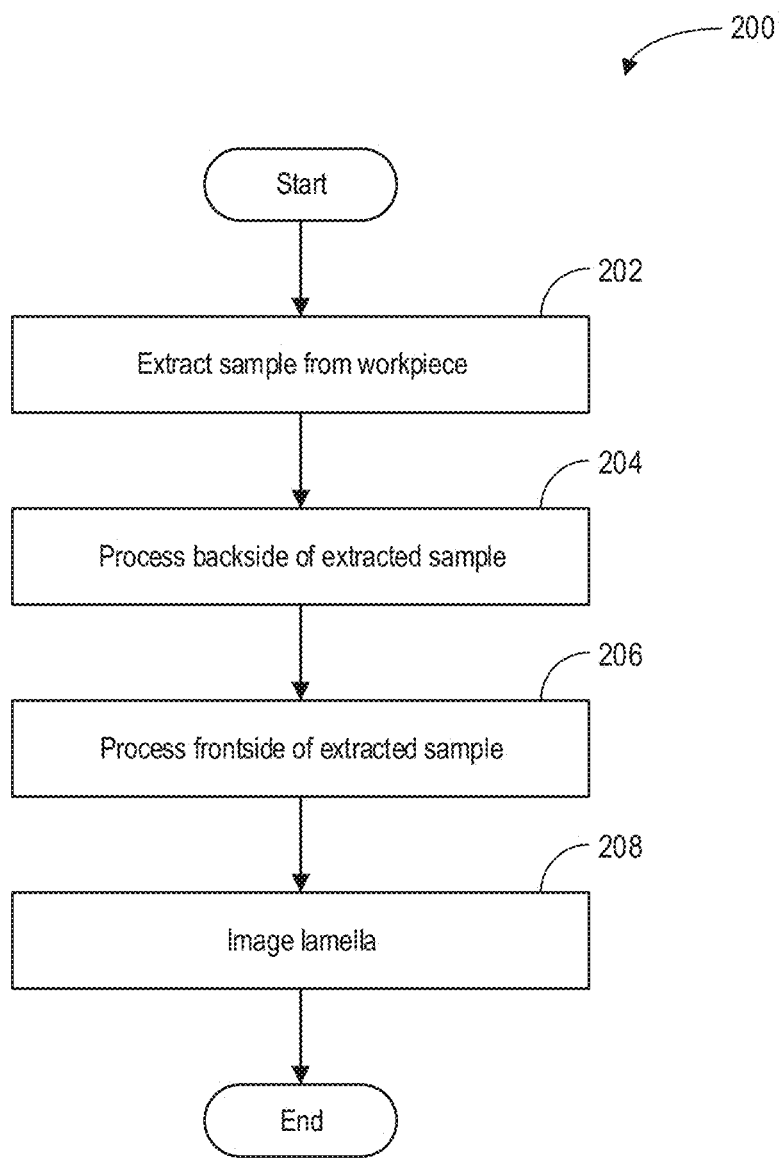
FIG. 2 shows a method for forming a lamella.
Figure 3A:
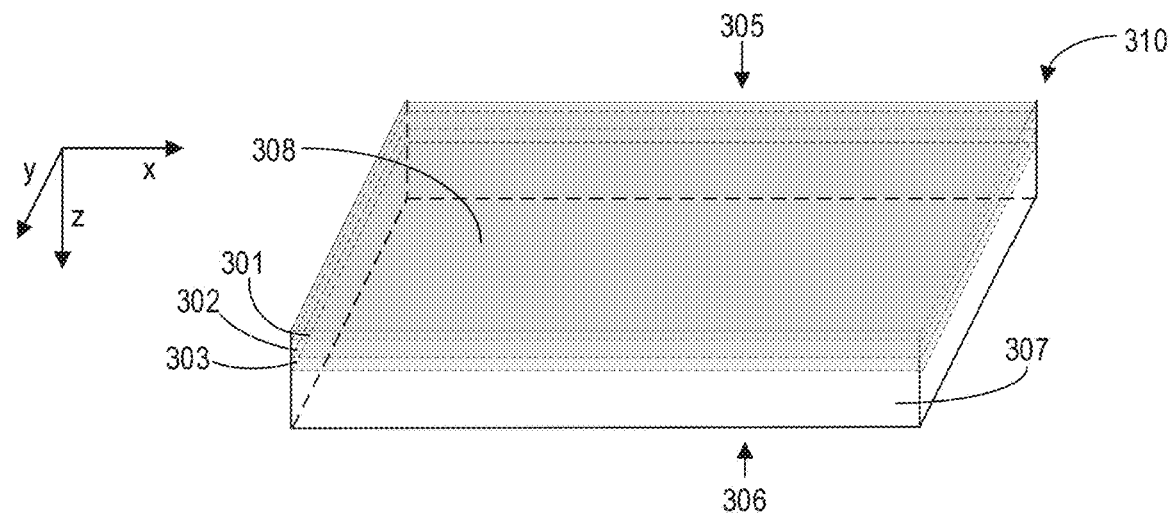
FIG. 3A shows a workpiece with multiple device layers.
Figure 3B:
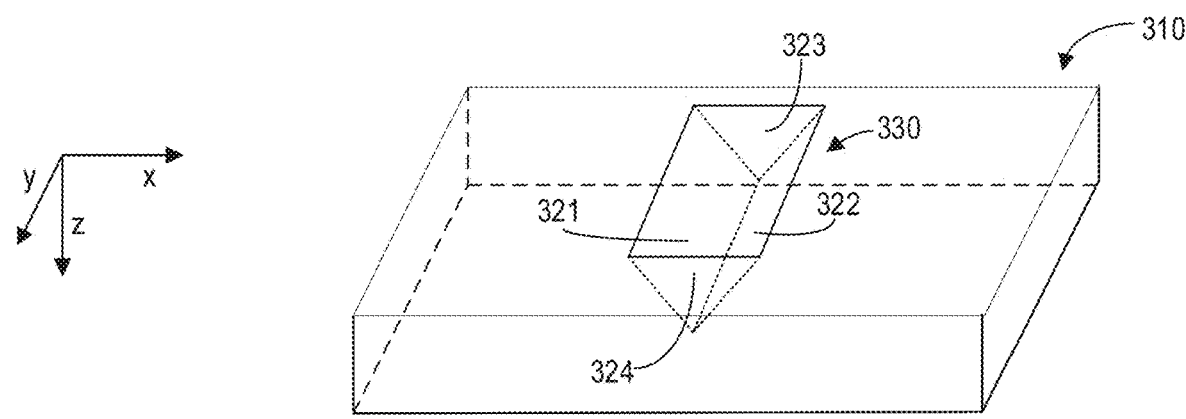
FIG. 3B illustrates a sample extracted from the workpiece.
Figure 3C:
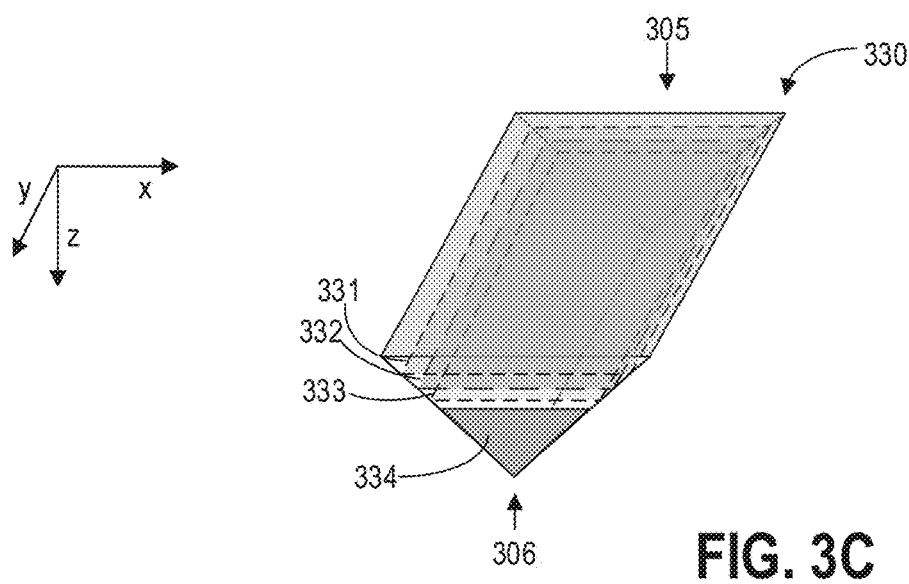
FIG. 3C illustrates the extracted sample.

The planar view lamella may be formed according to the method shown in FIG. 2. A sample is milled and extracted from the workpiece. The multiple device layers in the extracted sample extend parallel to the surface of the workpiece, as shown in FIGS. 3A-3B. The frontside surface of the extracted sample, as shown in FIG. 3C, is a part of the top surface of the workpiece. On the backside of the extracted sample, the final or bottom device layer is embedded under at least a layer of substrate, such as silicon substrate. In some examples, a spacing layer, such as a silicon dioxide layer, may be positioned between the substrate layer and the final device layer. There is no other device layer between the final device layer and the substrate layer. Materials on the backside and the frontside of the extracted sample are removed to obtain the planar view lamella with a specific device layer exposed from both the backside and the frontside within a region of interest (ROI). For example, to obtain the planar view lamella backside, materials covering the final device layer (such as the substrate layer and the spacing layer) are removed to expose the final device layer. Then, one or more device layers from the sample backside may be removed through a delayering process.

In order to form a planar view lamella with flat and large ROI, the exposed final device layer has to be flat and parallel to the device layer. One way to remove the substrate is spontaneously etching the sample backside with $XeF_2$.

Because $XeF_2$ selectively etches silicon, a part of the final device layer may be preserved after etching. However, it is difficult to control the exposure time of the $XeF_2$ etching: a short exposure time may under-etch the silicon substrate; and a long exposure time may over-etch some materials, such as polysilicon in the device layers. Under-etching may reduce the area of the exposed final device layer, therefore reducing the ROI. Over-etching, on the other hand, may result in uneven and damaged device layers. For example, device layers close to the silicon substrate, such as the 0-5 device layers away from the silicon substrate cannot be observed.

Figure 5:
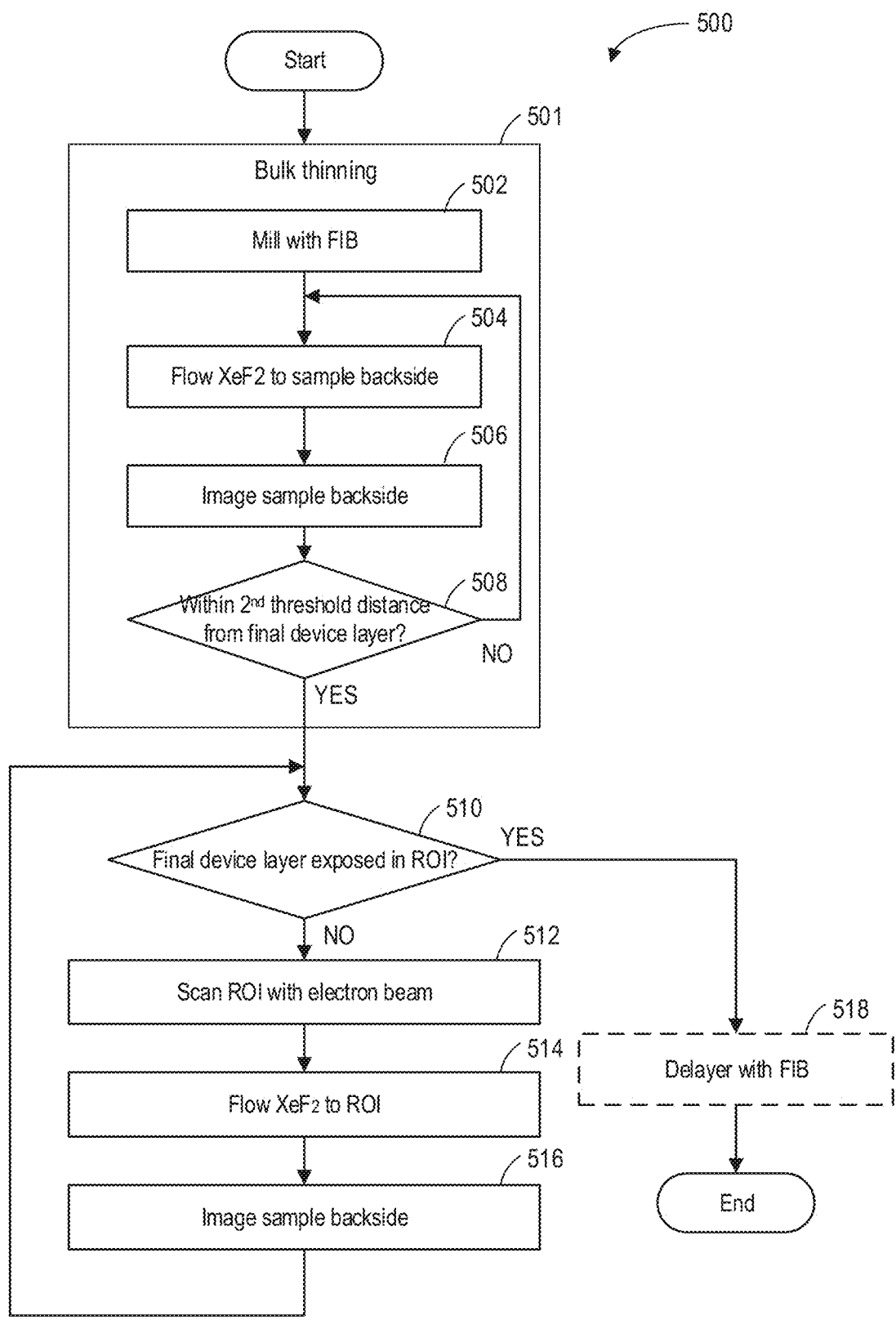
FIG. 5 is a flowchart for processing a backside of the sample extracted from the workpiece.

A method for preparing the backside of the planar view lamella is shown in FIG. 5. The sample backside may be bulk-thinned with focused ion beam (FIB) and/or spontaneous etched with an etching gas. When the exposed backside sample surface approaches the final device layer, the ROI relative to the sample backside is alternately scanned with high current electron beam and spontaneously etched with $XeF_2$. The electron beam scanning is performed when $XeF_2$ is removed from the lower chamber, and the $XeF_2$ etching is performed without electron beam irradiation. The scanning-etching sequence may be performed for multiple iterations until most of the final device layer within the ROI is exposed. Herein, the final device layer is exposed when the devices or device structures (such as the memory cell in the 3D-NAND structure) in the final device layer are exposed. In one example, the iteration may be terminated when a ratio between the area of the final device layer exposed in the ROI and the total area of the ROI is greater than a threshold ratio. In another example, the iteration may be terminated when the exposed final device layer is even and flat. The duration of the spontaneous etching within each iteration may be constant and predetermined. The scanning-etching iterations remove materials covering the final device layer on the sample backside. If there is a spacing layer between the substrate layer and the final device layer, both the substrate layer and the spacing layer are removed during the iterations. After exposing the final device layer, one or more device layers from the sample backside may be removed through a delayering process to obtain the planar view lamella backside.

During the backside planar view lamella preparation, SEM images of the sample backside may be taken for monitoring the preparation process. The beam current for SEM imaging is lower than the beam current for scanning the ROI in the scanning-etching sequence. The beam current for SEM imaging may be lower than 1 nA, while the beam current for ROI scan may be higher than 1 nA. In an example, the beam current for SEM imaging is 100 pA to 1 nA, and the beam current for ROI scan is 2-4 nA. Further, in order to observe sample surface, the beam energy for SEM imaging may be lower than the beam energy for scanning the ROI in the scanning-etching sequence. For example, the beam energy for SEM imaging is lower than 10 kV (such as 2-10 kV), while the beam current for ROI scan is higher than 10 kV (such as 10-20 kV).

By scanning the ROI with high current electron beam, the ROI is deposited and/or doped with carbon. In some examples, a carbon source may be provided in the lower chamber. By depositing/doping the ROI using the electron beam, in the etching process immediately after the scanning, preferential etch rates between the device structures in the device layer and materials in the other layers (such as the substrate layer and the spacing layer) are achieved. For example, the silicon substrate is etched at a higher rate than the device structures during the $XeF_2$ etching. The preferential etch rates may be caused by a thin layer of carbon preferentially deposited over the non-homogeneous device materials of the device structures comparing to the relatively homogeneous substrate layer during the electron beam scan. Further, the electron beam scan may lead to enhanced adsorption of carbon species onto the device layer. The inherent mechanism for this enhancement may be due to material differences, topological considerations, or a combination thereof. Due to the preferential etch rates, materials covering the final device layer (such as the substrate layer and the spacing layer) may be selectively removed during the scanning-etching iterations, while the device structures near the substrate layers are preserved. As a result, a large and flat final device layer is exposed in the ROI.

Figure 6:
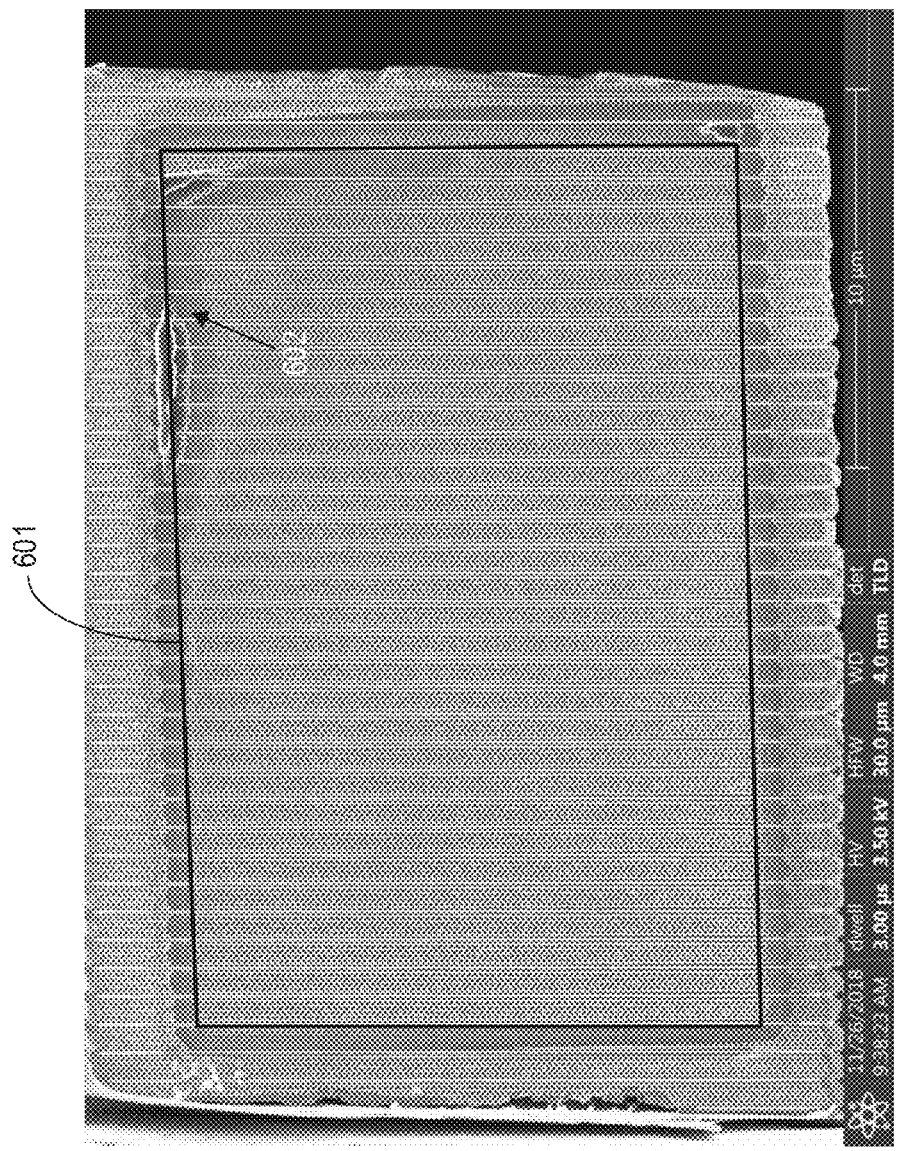
FIG. 6 is an image of a sample backside with exposed final device layer.

FIG. 6 is an SEM image of the sample backside with exposed final device layer. The sample with exposed final device layer may be delayered using FIB with or without an etch-assisting gas to obtain the planar view lamella backside. The sample backside surface formed using the method of FIG. 2 is flat and parallel to the device layers, which is reflected by signals received during the following backside delayering process shown in FIG. 7.

Figure 1:
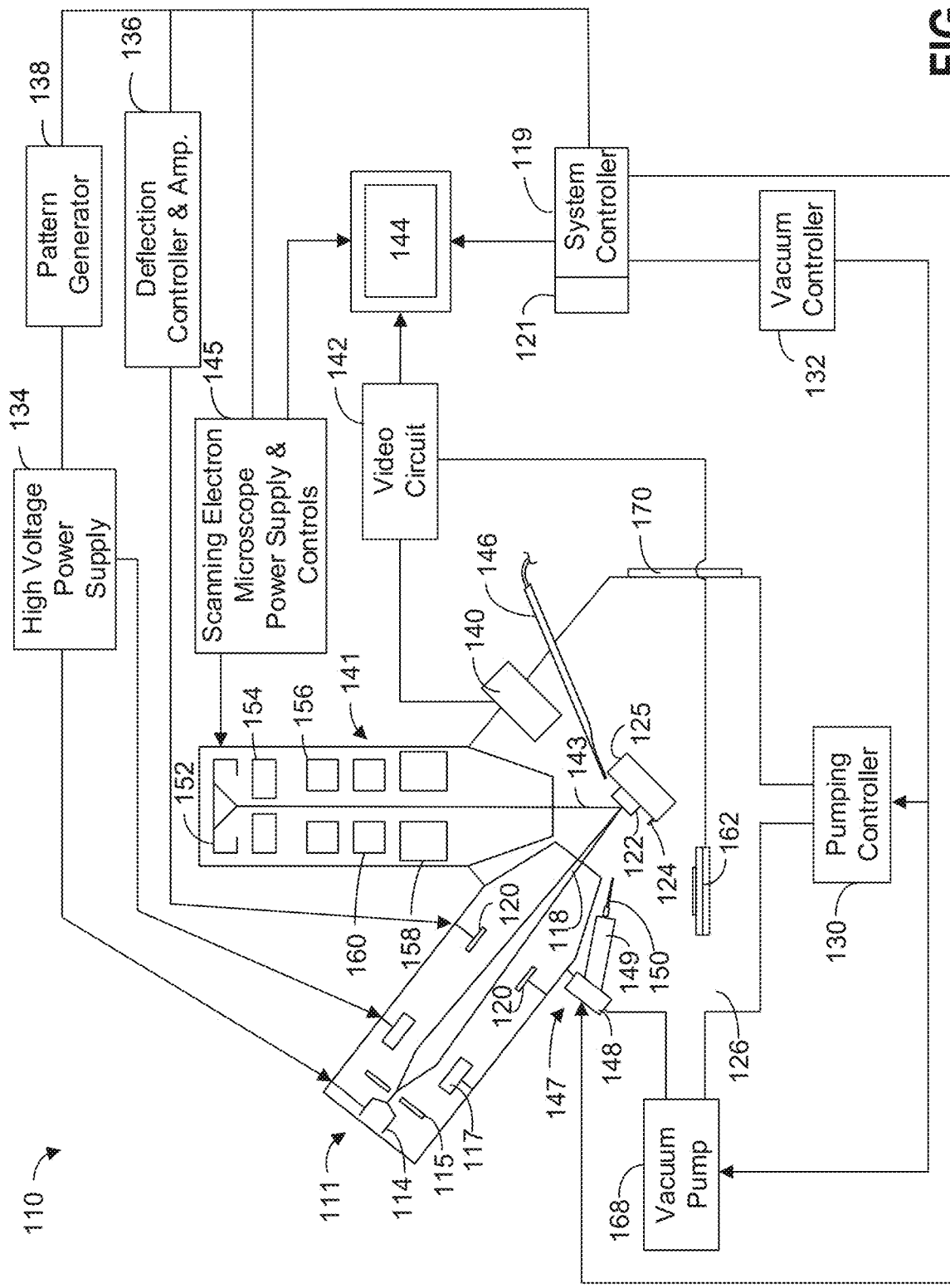
FIG. 1 shows a dual beam system, according to some embodiments of the invention.

Turning to FIG. 1, FIG. 1 shows a dual beam system 110. The dual beam system includes an ion beam that is either normal or tilted by a few degrees to the plane of a workpiece and an electron beam having an axis that is also tilted, e.g., 52 degrees from the axis of ion beam. In some implementations, the ion beam and electron beam are aligned so that the field of view of both beams are coincident to within a few microns. Both the ion beam and the electron beam may be used to image and/or process the specimen.

The dual beam system 110 includes an ion column 111 for generating the ion beam. The ion column 111 includes ion source 114, extractor electrodes 115, electrostatic optical system 117, and electrostatic deflection plate 120. Ion beam 118 generated by the ion source 114 is deflected by electrostatic deflector 120 before irradiates workpiece 122. Workpiece 122 is positioned on movable X-Y-Z stage 124 within lower chamber 126. Lower chamber 126 may be evacuated with turbomolecular and mechanical pumping system 168 under the control of pumping controller 130. The vacuum system provides within lower chamber 126 with a vacuum of between, e.g., approximately $5 \times 10^{-8}$ Torr and $5 \times 10^{-4}$ Torr. When an etch-assisting, an etch retarding, or a deposition precursor gas is used, the chamber background pressure may rise, e.g., to about $1 \times 10^{-5}$ Torr.

High voltage power supply 134 is connected to ion source 114 as well as to appropriate electrodes in ion column 111 for forming the ion beam 118 and directing the same downwardly. Deflection controller and amplifier 136, operated in accordance with a prescribed pattern provided by pattern generator 138, is coupled to deflection plates 120 whereby ion beam 118 may be controlled to trace out a corresponding pattern on workpiece 122. In some systems, the deflection plates are placed before the final lens.

The ion source 114 typically provides a metal ion beam of gallium, although other ion sources, such as a multi-cusp or other plasma ion source, can be used. The ion source 114 typically is capable of being focused into a sub one-tenth micron wide beam at workpiece 122 for either modifying the work piece 122 by ion milling, enhanced etch, material deposition, or for the purpose of imaging the workpiece 122. A charged particle multiplier 140 used for detecting secondary ion—or, e.g., as a secondary electron detector 140 for detecting secondary electron—emission for imaging is connected to signal processor 142, where the signals from charged particle multiplier 140 are amplified, converted into digital signals, and subjected to signal processing. The resulting digital signal is to display an image of workpiece 122 on the monitor 144.

An electron column 141, along with power supply and control unit 145, is also provided with the dual beam system 110. An electron beam 143 is emitted from a cathode 152 by applying voltage between cathode 152 and an anode 154. Electron beam 143 is focused to a fine spot by means of a condensing lens 156 and an objective lens 158. Electron beam 143 is scanned two-dimensionally on the workpiece by means of a deflection coil 160. Operation of condensing lens 156, objective lens 158, and deflection coil 160 is controlled by power supply and control unit 145. When the electrons in the electron beam 143 strike the surface of workpiece 122, secondary electrons and backscattered electrons are emitted. Respectively, these electrons are detected by SE detector 1240 or backscattered electron detector 162. The analog signal produced either by SE detector 140 or backscattered electron detector 162 is amplified and converted into a digital brightness value by signal processor unit 142. The resulting digital signal can be displayed as an image of work piece 122 on the monitor 144.

Micromanipulator 147 may comprise precision electric motors 148 to provide X, Y, Z, and theta control of a portion 149 positioned within the vacuum chamber. The micromanipulator 147 can be fitted with different end effectors for manipulating small objects, such as lifting out a sample cut out of the workpiece 122. In the embodiments described herein, the end effector is a thin probe 150.

A door 170 is opened for inserting work piece 122 onto stage 124, which may be heated or cooled, and also for servicing an internal gas supply reservoir, if one is used. The door is interlocked so that it cannot be opened if the system is under vacuum. A gas delivery system 146 extends into lower chamber 126 for introducing and directing a gaseous vapor toward workpiece 122.

System controller 119 controls the operations of the various parts of dual beam system 110. Through system controller 119, a user can cause ion beam 118 or electron beam 143 to be scanned in a desired manner through commands entered into a user interface (not shown). System controller 119 can also comprise computer-readable memory 121 and may control dual beam system 110 in accordance with data or computer-readable instructions stored in memory 121 to implement the methods described herein.

Apparatuses and systems described above may utilize high-accuracy beam placement method for local area navigation. Further, it should be recognized that elements, aspects or embodiments can be implemented via computer hardware or software, or a combination of both. Methods can be implemented in computer programs using standard programming techniques-including a computer-readable storage medium configured with a computer program, where the storage medium so configured causes a computer to operate in a specific and predefined manner-according to the methods and figures described in this specification. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits programmed for that purpose.

Further, methodologies may be implemented in any type of computing platform, including but not limited to, personal computers, mini-computers, main-frames, workstations, networked or distributed computing environments, computer platforms separate, integral to, or in communication with charged particle tools or other imaging devices, and the like. Aspects may be implemented in machine readable code stored on a storage medium or device, whether removable or integral to the computing platform, such as a hard disc, optical read and/or write storage mediums, RAM, ROM, and the like, so that it is readable by a programmable computer, for configuring and operating the computer when the storage media or device is read by the computer to perform the procedures described herein. Moreover, machine readable code, or portions thereof, may be transmitted over a wired or wireless network. Implementations described herein may include these and other various types of computer-readable storage media when such media contain instructions or programs for implementing the steps described above in conjunction with a microprocessor or other data processor. Implementations may also include the computer itself when programmed according to the methods and techniques described herein.

Computer programs can be applied to input data to perform the functions described herein and thereby transform the input data to generate output data. The output information is applied to one or more output devices such as a display monitor. In some implementations, the transformed data may represent physical and tangible objects, including producing a particular visual depiction of the physical and tangible objects on a display.

As indicated, some implementations may also make use of a charged particle beam, such as an ion beam or an electron beam, in order to image a sample using a beam of particles. Such charged particles used to image a sample may inherently interact with the sample resulting in some degree of physical transformation. Further, throughout the present specification, discussions utilizing terms such as "calculating," "determining," "measuring," "generating," "detecting," "forming," or the like, also refer to the action and processes of a computer system, or similar electronic device, that manipulates and transforms data represented as physical quantities within the computer system into other data similarly represented as physical quantities within the computer system or other information storage, transmission or display devices.

The ion beam and electron beams are described herein as examples of charged particle beams for imaging or processing the workpiece. Other charged particle beams, for example, a laser beam, or some other shaped ion beam, for example, from a liquid metal ion source, may be used.

FIG. 2 shows method 200 for preparing a planar view lamella using a dual beam system of FIG. 1. The planar view lamella is prepared for inspecting a device layer of a workpiece including multiple device layers. The device layers may have a 3D-NAND structure.

At 202, a sample is extracted from the workpiece. The sample may first be milled from the workpiece using FIB, and then lifted-out/extracted from the workpiece using the micromanipulator (such as the micromanipulator 147 of FIG. 1) for further processing. FIGS. 3A-3C illustrate the procedure of sample extraction.

In FIGS. 3A-3B, the workpiece 310 is oriented with a length and a width extend in the x-y plane, and a height extends along the z-axis. The workpiece includes one or more device layers manufactured over substrate 307. Substrate 307 may be silicon. The device layers extend in the x-y plane. The device layers may be separated from each other with a spacing layer. The spacing layer may be formed with silicon dioxide. In FIG. 3A, three device layers (301-303) are shown as an example. For 3D-NAND structure, the number of device layers may be in the tens or greater than one hundred. The top surface 308 of workpiece 310 on the frontside is parallel to the device layers. In one example, the final or bottom device layer 303 is in direct contact with the substrate 307. In another example, the final device layer 303 is separated from the substrate 307 with a spacing layer. The frontside of the workpiece is indicated by arrow 305 (in the z direction), and the backside of the workpiece is indicated by arrow 306 (opposite to the z direction).

FIG. 3B illustrates one method for cutting sample 330 from the workpiece 310. The workpiece 310 is first undercut by two intersecting ion beam cuts 321 and 322 from opposite directions. Then, the ion beam cuts the sides 323 and 324. Sample 330 may be lifted out from workpiece 310 by a probe for further processing.

FIG. 3C shows the extracted or lift-out sample 330. Sample 330 includes multiple device layers (331-333) on the frontside 305. The frontside surface of extracted sample is part of the top surface 308 of workpiece 310. Sample 330 includes at least one substrate layer 334 on the backside 306. The wedge-shaped substrate layer 334 has to be removed to expose the final device layer. The sample with exposed final device layer may be further delayered to remove one or more device layers from the frontside and/or backside to obtain the planar view lamella.

Turning back to FIG. 2, at 204, the backside of the extracted sample is processed to form the backside of the planar view lamella. The backside processing removes the wedge-shaped substrate layer (such as substrate layer 334 of FIG. 3C), and exposes the final device layer (such as final device layer 333 of FIG. 3C) that is adjacent to the substrate layer. Lamella backside preparation may further include delayering one or more device layers from the sample backside using FIB with or without an etch-assisting gas. Details of the backside processing is described in FIG. 5.

At 206, the frontside of the extracted sample is processed to form the frontside of the planar view lamella. The frontside processing may include delayering or removing a predetermined number of device layers from the frontside using FIB. The etch-assisting gas may optionally be provided with the FIB. In one example, a predetermined number of device layers are removed to expose a specific device layer embedded in the sample using face-on FIB.

In some examples, step 206 is omitted and only the sample backside is processed for inspecting the top device layers.

At 208, a high resolution TEM image of the planar view lamella is acquired. The metrology of a specific device layer may be determined based on the TEM image. The TEM image may be acquired in the dual beam system of FIG. 1, or alternatively in a different TEM system.

In this way, the device layer in the planar view lamella is parallel to the lamella's backside surface, as well as the lamella's frontside surface. The planar view lamella provides a large ROI within which a specific device layer can be imaged. Further, the specific device layer may be a device layer close to the substrate layer.

FIG. 5 shows method 500 for processing the backside of the lift-out sample to form the backside of the planar view lamella. The lift-out sample is firstly bulk-thinned by milling and/or etching. When the exposed sample backside surface approaches the final device layer, the sample backside within a ROI is alternately scanned using high current electron beam and spontaneously etched until most of the final device layer within the ROI is exposed. Then, one or more device layers may optionally be removed from the sample backside.

At 501, the backside of the sample is bulk-thinned to obtain a sample backside surface. The sample may be bulk-thinned with FIB milling and/or spontaneous etching. The bulk thinning process may remove most of the wedge-shaped substrate layer (such as substrate layer 334 of FIG. 3C) of the sample backside and provide a flat surface for further processing. Steps 502-508 show an example workflow for bulk thinning the sample backside.

At 502, the backside of the extracted sample is milled using FIB. The milling may be performed with an edge-on FIB, wherein the incident ion beam is at an angle less than 45 degrees from the sample surface. The sample backside may be milled using FIB with or without an etch-assisting gas. The milling process may be monitored based on images of the sample backside. In one example, the image is formed with secondary electrons collected during the milling. In another example, the image may be taken after scanning the ion beam across the sample's backside surface. The FIB milling may be terminated when the milled surface is approaching the final device layer. For example, the FIB milling is terminated when the milled surface is within a first threshold distance from the final device layer. In another example, the FIB milling is terminated after removing a first thickness of the substrate. The first substrate thickness may be determined based on the total thickness of the sample and the thickness of the device layers.

At 504, $XeF_2$ is flown to the sample backside to spontaneously etch the silicon substrate without assistance of the charged particle beams. In one example, the amount of the $XeF_2$ and/or the duration for flowing the $XeF_2$ may be determined based on a second thickness of the substrate to be removed. The second thickness of the to-be-removed substrate may be estimated based on thickness the removed substrate, the total sample thickness, and the thickness of the device layers.

At 506, after flowing $XeF_2$ to the sample, an SEM image of the sample backside surface is acquired for monitoring the spontaneous etching process. The SEM image may be taken with a beam current lower than 1 nA. For example, beam current for SEM imaging is 100 pA. The SEM image is taken when the chamber pressure is lowered and the $XeF_2$ is removed from the lower chamber.

At 508, method 500 determines whether the exposed sample backside is within a second threshold distance from the final device layer based on the image acquired at 506. The second threshold distance is smaller than the first threshold distance at 502. In some examples, the second threshold distance may be zero. That is, part of the final device layer is exposed due to the $XeF_2$ etching. If the exposed sample backside is within the second threshold distance from the final device layer, the spontaneous etching is terminated. Otherwise, $XeF_2$ is provided to further etch the sample backside.

At 510, method 500 checks whether the final device layer is exposed in a ROI related to the sample backside surface. The area of the ROI may be smaller than the area of the sample backside surface. For example, as shown in FIG. 6, the area of the ROI 601 is smaller than the cross-section area of the workpiece in the x-y plane. Therefore, the planar view lamella has at least one thick edge for supporting the thin delayered region of the lamella. In one example, the ROI may be determined based on the image of the sample backside surface. The ROI may be the region that the sample backside surface is non-uniform or uneven.

The final device layer within the ROI is exposed when the devices or device structures of the final device layer is not covered by the substrate layer or the spacing layer. In one example, the final device layer is exposed when a ratio between an area of the final device layer $A_{device\ layer}$ exposed in the ROI and the total area of the ROI $A_{ROI}$ is greater than a threshold ratio. The final device layer is not exposed when a ratio between an area of the final device layer $A_{device\ layer}$ exposed in the ROI and the total area of the ROI $A_{ROI}$ is not greater than the threshold ratio. The area of exposed final device layer within the ROI may be estimated based on the most recently acquired image of the sample backside. The image may be an SEM image acquired with low beam current, such as beam current lower than 1 nA. The image may be taken at step 506 or step 516. In one example, the threshold ratio is greater than 90%. In another example, the threshold ratio is greater than 95%. If the final device layer is exposed in the ROI, method 500 moves to 518 to further delayer one or more device layers from the sample backside. If the final device layer is not exposed in the ROI, method 500 moves to 512. The ROI is alternately scanned by high current electron beam and spontaneously etched, until the device final layer is mostly exposed.

In another example, the final device layer is exposed when the final device layer within the ROI is flat. The flatness may be determined based on the most recently acquired SEM image. For example, any variation in surface uniformity observed in the SEM image may indicate unevenness.

At 512, the ROI related to the sample backside surface is scanned with high current electron beam. By scanning the ROI with the electron beam, carbon may be deposited or doped to the scanned region. The beam current for scanning the ROI is higher than the electron beam for SEM imaging at 506 or 516. For example, the beam current for ROI scanning is greater than 1 nA, and the beam current for imaging is lower than 1 nA. As one example, the electron beam energy for scanning the ROI is 10 kV, and the beam current is 3.2 nA. The beam energy for scanning the ROI is higher than the beam energy for SEM imaging at 506 and 516. The duration for scanning the ROI is longer than the duration for acquiring the SEM image at 506 and 516. In one example, the ROI is scanned without detecting the scattered electrons. That is, no SEM image is formed by scanning the ROI with the electron beam. In another example, an SEM image of the ROI is acquired based on scattered electrons received during the ROI scan.

At 514, the scanned ROI is spontaneously etched. The scanned ROI is spontaneously etched with $XeF_2$ for a predetermined duration. The duration of the etch process may be determined by an interaction cross-section of a XeF2 molecule with the substrate material. In one example, the ROI is scanned with high current electron beam for one minute. The scanned ROI is subsequently spontaneously etched for one minute. The duration of $XeF_2$ flow in step 514 may be shorter than the duration of the $XeF_2$ flow at 504.

At 516, an image including the etched ROI is taken. The image may be an SEM image acquired with parameters similar to the SEM image acquired at 506. For example, electron beam current and energy are lower than the beam current and energy for ROI scan at 512. The beam energy is lowered to decrease the electron penetration depth, so that more surface electrons are excited for better observation of the etched surface.

At 518, the device layers within the ROI is optionally delayered with FIB to remove a predetermined number of layers. The delayering process may be performed by scanning the ROI with face-on FIB with or without the etch-assisting gas. The face-on FIB has an angle larger than 45 degree from the exposed sample surface within the ROI. The etch-assisting gas may be methyl nitroacetate (MNA) or an MNA-like gas. In one example, the etch-assisting gas comprises methyl nitroacetate. In other examples, the etch-assisting gas is a combination of one or more of methyl acetate, ethyl acetate, ethyl nitroacetate, propyl acetate, propyl nitroacetate, nitro ethyl acetate, methyl methoxyacetate, or methoxy acetylchloride. The delayering process may be monitored based on secondary electrons or stage current recorded during each FIB scan of the ROI.

In this way, a large area of the final device layer may be exposed. The exposed final device layer is flat due to the selective etching of the carbon deposited/doped surface. Further, damage to devices layers close to the substrate layer is prevented.

FIG. 6 shows an SEM image of the sample backside with the final device layer of a 3D-NAND structure exposed in the ROI 601 after multiple scanning-etching iterations (steps 510-514 of FIG. 5). Patterns of the final device layer can be seen with high contrast in a large area of the ROI. Arrow 602 points to a region close to the edge of the ROI 601 that is covered with silicon substrate. Delayering may be further performed within ROI 601 to remove one or more device layers.

Figure 7:
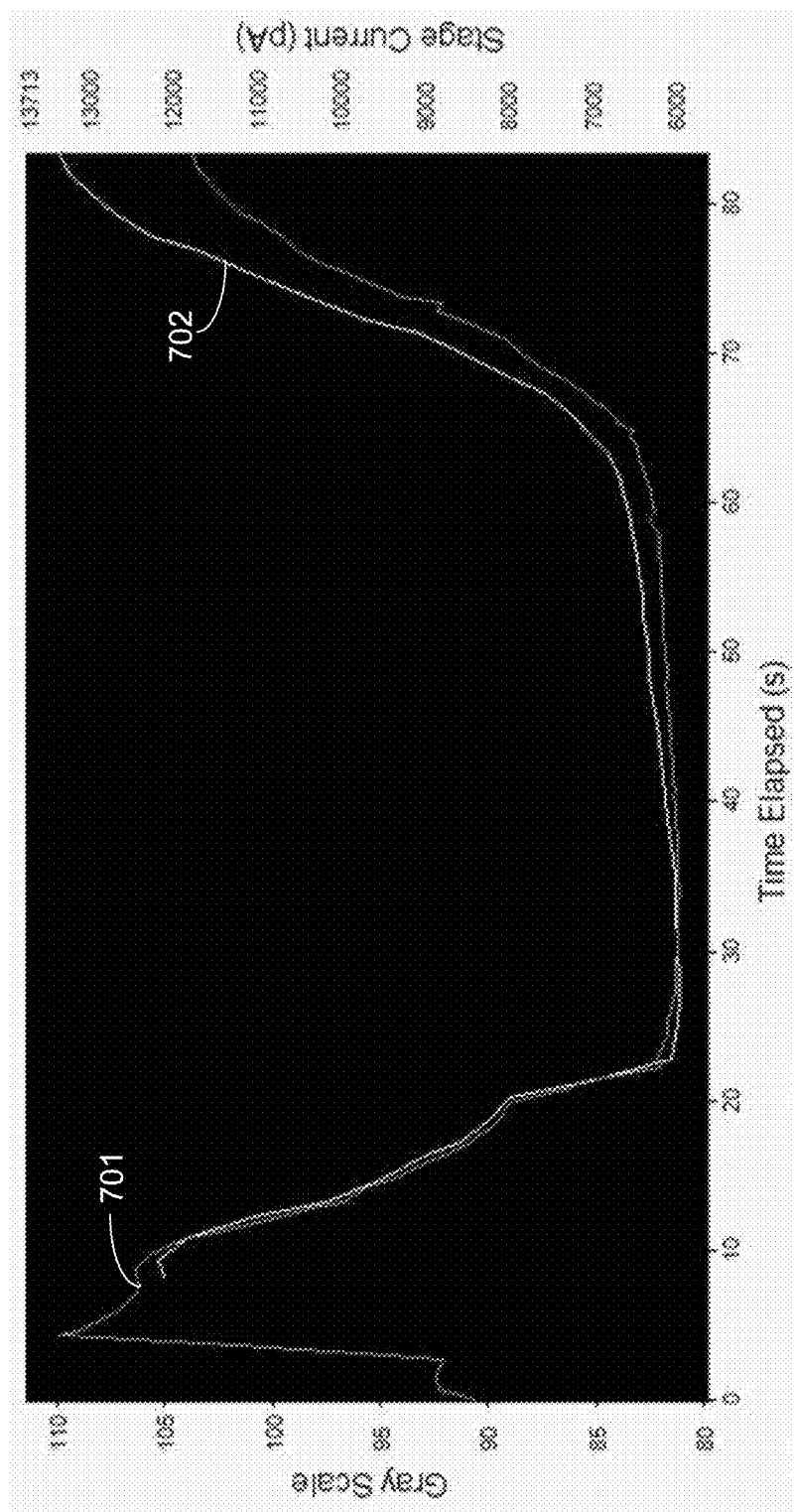
FIG. 7 shows signals received during a delayering process.

FIG. 7 shows a graph generated based on the secondary electrons and the stage current collected during the delayering process from the sample backside. The sample includes multiple device layers of the 3D-NAND structure. The device layers are removed using FIB starting from the final device layer. Grayscale plot 701 is the total grayscale level of the image formed with the secondary electrons. The higher the grayscale level corresponds to lower number of collected secondary electrons. Stage current plot 702 is the total stage current sensed during each scan of the FIB over the ROI.

Both the grayscale plot 701 and stage current plot 702 decrease from a first peak from 4 second time point, then increase again from around 60 second time point. The first peak around 4 second time point corresponds to delayering the final device layer. The second peak around 80 second time point corresponds to delayering the next-to-final device layer. As the delayering process progresses through the final device layer, plots 701 and 702 decrease from 4 second to 23 second. The low grayscale level and stage current from 23 second to 65 second indicates that the spacing layer of the 3D-NAND structure is being removed. The smooth ascents of both plots to the second peak from 60 second to 80 second indicate that the sample surface is flat and parallel to the device layers.

The technical effect of scanning the ROI with the electron beam before spontaneously etching the sample is that the etch rate of at least a part of the device layer is reduced, and over-etching of the final device layer is prevented. The technical effect of scanning the ROI with high current electron beam is to deposit/dope the ROI with carbon. The technical effect of imaging the sample surface with low energy electron beam during lamella backside processing is to acquire image with low penetration depth. The technical effect of repeating the scanning-etching process is that the substrate layer is selectively etched while preserving the devices in the device layer.

In one embodiment, a method for processing a sample including at least a substrate layer and a device layer using charged particle beams, includes removing a part of the substrate layer to obtain a sample surface; scanning a region of interest (ROI) relative to the sample surface with an electron beam; flowing a first gas towards the ROI to spontaneously etch the scanned ROI; and scanning the etched ROI with the electron beam responsive to the device layer not exposed in the ROI. In a first example of the method, the method further includes acquiring a sample image including the etched ROI, and determining the device layer not exposed in the ROI based on the sample image. A second example of the method optionally includes the first example and further includes, wherein the sample image is a scanning electron microscopy (SEM) image, and a beam current of the electron beam for scanning the ROI is higher than a beam current for acquiring the sample image. A third example of the method optionally includes one or more of the first and second examples, and further includes, wherein the sample image is an SEM image, and a beam energy of the electron beam for scanning the ROI is higher than a beam energy for acquiring the sample image. A fourth example of the method optionally includes one or more of the first to third examples, and further includes, wherein a duration for scanning the ROI is longer than the duration for acquiring the sample image. A fifth example of the method optionally includes one or more of the first to fourth examples, and further includes, wherein determining the device layer not exposed in the ROI based on the sample image includes determining the etched ROI not flat based on the sample image. A sixth example of the method optionally includes one or more of the first to fifth examples, and further includes, wherein determining the device layer not exposed in the ROI based on the sample image includes determining a ratio between an area of the device layer exposed in the ROI and an area of the ROI not greater than a threshold ratio. A seventh example of the method optionally includes one or more of the first to sixth examples, and further includes, wherein scanning the ROI with the electron beam includes scanning the ROI with the electron beam to deposit or dope the ROI with carbon. An eighth example of the method optionally includes one or more of the first to seventh examples, and further includes, wherein flowing the first gas towards the sample surface includes flowing the first gas for a predetermined first, predetermined, duration. A ninth example of the method optionally includes one or more of the first to eighth examples, and further includes, wherein removing a part of the substrate layer includes flowing a second gas towards the sample surface for a second duration to etch the sample surface, the second duration is longer than the first duration. A tenth example of the method optionally includes one or more of the first to ninth examples, and further includes, wherein removing a part of the substrate layer includes milling the substrate layer with a focused ion beam.

In one embodiment, a method for preparing a planar view lamella using charged particle beams, includes extracting a sample from a workpiece with a focused ion beam, the sample includes at least a device layer and a substrate layer; removing a part of the substrate layer from a backside of the sample to obtain a sample surface; and alternately scanning a region of interest (ROI) relative to the sample surface with an electron beam and flowing a gas towards the scanned ROI, until the device layer is exposed within the ROI, wherein the scanned ROI is spontaneously etched by the gas. In a first example of the method, the method further includes determining the device layer is exposed within the ROI when a ratio between an area of the device layer exposed in the ROI and an area of the ROI greater than a threshold ratio. A second example of the method optionally includes the first example and further includes, wherein the sample includes multiple device layers and the exposed device layer is a final device layer of the multiple device layers; and the method further comprising: removing at least one device layer of the multiple device layers from the backside of the sample after the final device layer is exposed within the ROI. A third example of the method optionally includes one or more of the first and second examples, and further includes forming the planar view lamella based on the sample with the device layer exposed; and imaging the planar view lamella in a transmission electron microscope. A fourth example of the method optionally includes one or more of the first to third examples, and further includes removing at least one device layer of the multiple device layers from a frontside of the sample, the frontside opposite from the backside.

In one embodiment, a system for processing a sample including at least a substrate layer and a device layer includes a first column for forming a focused ion beam; a second column for forming an electron beam; a lower chamber coupled with both the first column and the second column; a gas supply system coupled to the lower chamber; and a controller, with instructions saved in a non-transitory memory, the controller is configured to: remove a part of the substrate layer to obtain a sample surface; scan a region of interest (ROI) relative to the sample surface with the electron beam; flow a gas towards the ROI via the gas supply system to spontaneously etch the scanned ROI; and scan the etched ROI with the electron beam responsive to the device layer not exposed in the ROI. In a first example of the system, the system further includes wherein includes instructions to further cut the sample from a workpiece using the focused ion beam before removing the part of the substrate layer to obtain the sample surface. A second example of the system optionally includes the first example and further includes, wherein the sample includes multiple device layers, the device layer is a final device layer adjacent to the substrate layer, and the controller is further configured to remove one or more device layers with the focused ion beam in the presence of an etch-assisting gas after the final device layer in the ROI is exposed. A third example of the system optionally includes one or more of the first and second examples, and further includes, wherein the controller is further configured to flow the gas towards the scanned ROI after scanning the etched ROI with the electron beam.

What is claimed is:

1. A method for processing a sample including at least a substrate layer and a device layer using charged particle beams, comprising:
    removing at least a part of the substrate layer to obtain a sample surface;
    scanning a region of interest (ROI) relative to the sample surface with an electron beam;
    flowing a first gas towards the ROI to spontaneously etch the scanned ROI; and
    scanning the etched ROI with the electron beam responsive to the device layer not being exposed in the ROI.

2. The method of claim 1, further comprising acquiring a sample image including the etched ROI, and determining the device layer not being exposed in the ROI based on the sample image.

3. The method of claim 2, wherein the sample image is a scanning electron microscopy (SEM) image, and a beam current of the electron beam for scanning the ROI is higher than a beam current for acquiring the sample image.

4. The method of claim 2, wherein the sample image is an SEM image, and a beam energy of the electron beam for scanning the ROI is higher than a beam energy for acquiring the sample image.

5. The method of claim 2, wherein a duration for scanning the ROI is longer than the duration for acquiring the sample image.

6. The method of claim 2, wherein determining the device layer not being exposed in the ROI based on the sample image includes determining the etched ROI not flat based on the sample image.

7. The method of claim 2, wherein determining the device layer not being exposed in the ROI based on the sample image includes determining a ratio between an area of the device layer exposed in the ROI and an area of the ROI not greater than a threshold ratio.

8. The method of claim 1, wherein scanning the ROI with the electron beam includes scanning the ROI with the electron beam to deposit or dope the ROI with carbon.

9. The method of claim 1, wherein flowing the first gas towards the sample surface includes flowing the first gas for a predetermined first, predetermined, duration.

10. The method of claim 1, wherein removing at least a part of the substrate layer includes flowing a second gas towards the sample surface for a second duration to etch the sample surface, the second duration is longer than the first duration.

11. The method of claim 1, wherein removing at least a part of the substrate layer includes milling the substrate layer with a focused ion beam.

12. A method for preparing a planar view lamella using charged particle beams, comprising:
   extracting a sample from a workpiece with a focused ion beam, the sample includes at least a device layer and a substrate layer;
   removing at least a part of the substrate layer from a backside of the sample to obtain a sample surface; and
   alternately scanning a region of interest (ROI) relative to the sample surface with an electron beam and flowing a gas towards the scanned ROI, until the device layer is exposed within the ROI, wherein the scanned ROI is spontaneously etched by the gas.

13. The method of claim 12, further comprising determining the device layer is exposed within the ROI responsive to a ratio between an area of the device layer exposed in the ROI and an area of the ROI greater than a threshold ratio.

14. The method of claim 12, wherein the sample includes multiple device layers and the exposed device layer is a final device layer of the multiple device layers; and the method further comprising: removing at least one device layer of the multiple device layers from the backside of the sample after the final device layer is exposed within the ROI.

15. The method of claim 12, further comprising forming the planar view lamella based on the sample with the device layer exposed; and imaging the planar view lamella with a transmission electron microscope.

16. The method of claim 12, further comprising removing at least one device layer of the multiple device layers from a frontside of the sample, the frontside opposite from the backside.

17. A system for processing a sample including at least a substrate layer and a device layer, comprising:
   a first column for forming a focused ion beam;
   a second column for forming an electron beam;
   a lower chamber coupled with both the first column and the second column;
   a gas supply system coupled to the lower chamber; and
   a controller, with instructions saved in a non-transitory memory, the controller is configured to:
      remove at least a part of the substrate layer to obtain a sample surface;
      scan a region of interest (ROI) relative to the sample surface with the electron beam;
      flow a gas towards the ROI via the gas supply system to spontaneously etch the scanned ROI; and
      scan the etched ROI with the electron beam responsive to the device layer not being exposed in the ROI.

18. The system of claim 17, wherein the controller includes instructions to further mill the sample from a workpiece using the focused ion beam before removing the at least a part of the substrate layer to obtain the sample surface.

19. The system of claim 17, wherein the sample includes multiple device layers, the device layer is a final device layer adjacent to the substrate layer, and the controller is further configured to remove one or more device layers with the focused ion beam in the presence of an etch-assisting gas after the final device layer in the ROI is exposed.

20. The system of claim 17, wherein the controller is further configured to flow the gas towards the scanned ROI after scanning the etched ROI with the electron beam.

* * * * *